United States Patent
Haji et al.

(10) Patent No.: US 7,927,973 B2
(45) Date of Patent: Apr. 19, 2011

(54) METHOD FOR DIVIDING SEMICONDUCTOR WAFER AND MANUFACTURING METHOD FOR SEMICONDUCTOR DEVICES

(75) Inventors: Hiroshi Haji, Fukuoka (JP); Kiyoshi Arita, Fukuoka (JP); Akira Nakagawa, Saga (JP); Kazuhiro Noda, Fukuoka (JP)

(73) Assignee: Panasonic Corporation, Osaka (JP)

( * ) Notice: Subject to any disclaimer, the term of this patent is extended or adjusted under 35 U.S.C. 154(b) by 472 days.

(21) Appl. No.: 11/663,543

(22) PCT Filed: Oct. 4, 2005

(86) PCT No.: PCT/JP2005/018713
§ 371 (c)(1),
(2), (4) Date: Mar. 22, 2007

(87) PCT Pub. No.: WO2006/038699
PCT Pub. Date: Apr. 13, 2006

(65) Prior Publication Data
US 2009/0197393 A1    Aug. 6, 2009

(30) Foreign Application Priority Data
Oct. 5, 2004 (JP) ................. 2004-292181

(51) Int. Cl.
*H01L 21/78* (2006.01)
*H01L 21/308* (2006.01)
(52) U.S. Cl. ................. 438/462; 438/463; 257/E21.599
(58) Field of Classification Search ........... 257/E21.001, 257/E21.599; 438/460–465, 110, 113, 114; H01L 21/78, 21/301, 21/308, 21/3065
See application file for complete search history.

(56) References Cited

U.S. PATENT DOCUMENTS

| | | | |
|---|---|---|---|
| 3,756,872 A | 9/1973 | Goodman | |
| 6,498,075 B1 | 12/2002 | Fujimoto et al. | |
| 2004/0052512 A1* | 3/2004 | Aderhold et al. | 392/418 |
| 2004/0102025 A1* | 5/2004 | Arita | 438/460 |
| 2004/0259322 A1* | 12/2004 | Lu et al. | 438/426 |
| 2005/0266661 A1* | 12/2005 | Li et al. | 438/462 |

(Continued)

FOREIGN PATENT DOCUMENTS
EP    1 139 415    10/2001
(Continued)

OTHER PUBLICATIONS
Ban et al. JP 2004221423 A machine translation.*
(Continued)

*Primary Examiner* — Matthew C Landau
*Assistant Examiner* — Aaron Staniszewski
(74) *Attorney, Agent, or Firm* — Wenderoth, Lind & Ponack, L.L.P.

(57) ABSTRACT

In a semiconductor wafer including a plurality of imaginary-divided-regions which are partitioned by imaginary-dividing-lines that are respectively arranged in a grid-like arrangement on the semiconductor wafer and a circumferential line that is the outer periphery outline of the semiconductor wafer, a mask is placed so as to expose an entirety of surfaces of the wafer corresponding to respective removal-regions. The removal-regions are regions in approximately triangular form partitioned by the circumferential line of the wafer and the imaginary-dividing-lines. Then, plasma etching is performed on a mask placement-side surface of the wafer, by which the semiconductor wafer is divided into the individual semiconductor devices along dividing lines while portions corresponding to the removal-regions of the wafer are removed.

6 Claims, 11 Drawing Sheets

U.S. PATENT DOCUMENTS

2006/0024923 A1 * 2/2006 Sarma et al. .................. 438/462

FOREIGN PATENT DOCUMENTS

| FR | 2081250 A * | 12/1971 |
| --- | --- | --- |
| JP | 57-114251 | 7/1982 |
| JP | 62-109352 | 5/1987 |
| JP | 2003-151924 | 5/2003 |
| JP | 2003-173987 | 6/2003 |
| JP | 2004-055684 | 2/2004 |
| JP | 2004-193305 | 7/2004 |
| JP | 2004-221423 | 8/2004 |
| JP | 2004221423 A * | 8/2004 |
| WO | 03/071591 | 8/2003 |

OTHER PUBLICATIONS

11663543_2010-07-21-FR_2081250_A_H.*
International Search Report issued in the International (PCT) Application of which the present application is the U.S. National Stage.

* cited by examiner

METHOD FOR DIVIDING SEMICONDUCTOR WAFER AND MANUFACTURING METHOD FOR SEMICONDUCTOR DEVICES

BACKGROUND OF THE INVENTION

1. Technical Field

The present invention relates to a method for dividing a semiconductor wafer according to which a semiconductor wafer having a plurality of semiconductor devices is divided into individual pieces, such that each is one of the above described semiconductor devices, as well as a manufacturing method for semiconductor devices.

2. Description of the Related Art

Various processes for dividing a semiconductor wafer of this type, that is to say, various manners of a dicing process in semiconductor device manufacturing processes have been known. There is, for example, a method for dividing semiconductor devices that have been respectively formed on a semiconductor wafer into individual semiconductor devices by mechanically cutting the semiconductor wafer along dividing lines using a disc-shaped cutter that uses diamond or the materials and is referred to as a dicer (see, for example, Japanese Unexamined Patent Publication No. 2003-173987). In addition to such a method for dicing using the dicer, there is a method for dividing a semiconductor wafer by radiating a laser beam along the dividing lines (see, for example, Japanese Unexamined Patent Publication No. 2003-151924).

In accordance with these conventional methods for dividing a semiconductor wafer using a dicer or a laser beam as described above, the semiconductor wafer is cut along the dividing lines which are arranged in a grid-like arrangement on the surface of the semiconductor wafer, and thereby, the semiconductor wafer is divided into individual pieces, each of which is a semiconductor device in rectangular form.

SUMMARY OF THE INVENTION

In the conventional dicing process, as described above, the semiconductor wafer, in approximately circular form, is cut along each of the dividing lines that are arranged in a grid-like arrangement. Therefore, there are inevitably a number of small pieces of the wafer that do not become part of a semiconductor device region in a rectangular form, in the vicinity of the circumference of the semiconductor wafer. Such pieces cannot be utilized as the semiconductor devices, and are, in the end, disposed of as waste after the respective semiconductor devices have been picked up from the divided semiconductor wafer.

More than ever in recent years, the semiconductor devices are being miniaturized, and together with this, the small pieces of the wafer that are created through the dicing process have also been miniaturized. In the case where the pieces of wafer are miniaturized in this manner, however, the small pieces of wafer that have been made to adhere to a wafer sheet on which the dicing process has been carried out, are caused to jump off, because of the expansion of this wafer sheet at the time when this wafer sheet is expanded. As a result, the pieces stick to the surface of the semiconductor devices, and in some cases, a problem arises due to the pieces causing failure in the mounting of these semiconductor devices.

In particular, this tendency becomes significant as the pieces of wafer are miniaturized, as described above. In addition, in some cases, the small pieces of the wafer jump off because of vibration in the wafer sheet, caused by the pick-up operation at the time when the individual semiconductor devices are picked up, in addition to when the wafer sheet is expanded.

Accordingly, an object of the present invention is to solve the above-described problem and provide a method for dividing a semiconductor wafer, as well as a manufacturing method for semiconductor devices according to which a semiconductor wafer having a plurality of semiconductor devices can be divided into individual pieces. Each of the pieces is one of the above-described semiconductor devices while preventing pieces of wafer created through this dividing process from sticking to the surface of any of the semiconductor devices that have been divided into individual pieces.

In order to achieve the above-described object, the present invention provides the following configuration.

According to a first aspect of the present invention, there is provided a method for dividing a semiconductor wafer, comprising:

placing a mask on a mask placement-side surface of the semiconductor wafer which has a plurality of semiconductor devices each of which is formed in each of unit-device-formation-regions, with the unit-device-formation-regions being regions in rectangular form partitioned by imaginary-dividing-lines and being some of a plurality of imaginary-divided-regions which are partitioned by the imaginary-dividing-lines that are respectively arranged in a grid-like arrangement on the semiconductor wafer and a circumferential line that is an outer periphery outline of the semiconductor wafer, the mask is placed so as to define dividing lines for dividing into individual pieces of the semiconductor devices by arranging the dividing lines on the wafer while aligning with the imaginary-dividing-lines, and so as to expose an entirety of surfaces of the wafer corresponding to respective removal-regions, with the removal-regions being regions in approximately triangular form partitioned by the circumferential line of the wafer and the imaginary-dividing-lines and being some of the imaginary-divided-regions, and performing plasma etching on the mask placement-side surface of the wafer on which the mask is placed, by which the semiconductor wafer is divided into the individual semiconductor devices along the defined dividing lines while portions correspond to the removal-regions in the wafer are removed.

According to a second aspect of the present invention, there is provided the method for dividing a semiconductor wafer as defined in the first aspect, wherein each line segment which is formed of each of the imaginary-dividing-lines, which partitions each of the removal-regions has a length which is shorter than the length of each line segment which partitions each of the unit-device-formation-regions.

According to a third aspect of the present invention, there is provided the method for dividing a semiconductor wafer as defined in the first aspect, wherein in placing the mask, the dividing lines are defined by placing the mask on the mask placement-side surface so as to expose an entirety of surfaces of the wafer corresponding to the positions on which the imaginary-dividing-lines are arranged.

According to a fourth aspect of the present invention, there is provided the method for dividing a semiconductor wafer as defined in the first aspect, wherein all of regions which do not correspond to the unit-device-formation-regions from among the imaginary-divided-regions are assumed to be the removal-regions, and then the mask is placed on the surface so as to expose the entirety of surfaces of the wafer corresponding to the respective removal-regions.

According to a fifth aspect of the present invention, there is provided the method for dividing a semiconductor wafer as defined in the first aspect, wherein in placing the mask on the wafer, the mask is placed so as to cover the entire mask placement-side surface, and then the mask is partially removed along the dividing lines of the wafer so as to expose the surface of the wafer, while the mask is partially removed so as to expose the surfaces corresponding to the removal-regions.

According to a sixth aspect of the present invention, there is provided the method for dividing a semiconductor wafer as defined in the first aspect, wherein in placing the mask on the wafer, positional information on the removal-regions in the wafer is acquired, and then the mask is placed so as to expose the entirety of the surfaces corresponding to the removal-regions on a basis of the acquired positional information.

According to a seventh aspect of the present invention, there is provided a manufacturing method for semiconductor devices, comprising:

dividing the semiconductor wafer into the individual semiconductor devices along the dividing lines while removing the removal-regions of the wafer, in accordance with the method for dividing the semiconductor wafer as defined in any of the first aspect to the sixth aspect, and removing the mask by performing the ashing process on the mask placement-side surface of the wafer, thereby, the semiconductor devices are manufactured as individual pieces.

According to the first aspect of the present invention, regions in approximately triangular form, which are relatively small regions, from among regions that do not become unit-device-formation-regions in the respective imaginary-divided-regions are assumed to be removal-regions to be removed, and plasma etching is carried out using a mask that has been placed so as to expose portions (regions) of the surface of the semiconductor wafer that correspond to the removal-regions, and thereby, the portions that correspond to the removal-regions in the above described semiconductor wafer can be removed and eliminated. Accordingly, the formation of comparatively small pieces in the semiconductor wafer can be prevented, and thus, the occurrence of problems caused by such pieces of the wafer, for example, problems where such pieces stick to surfaces of semiconductor devices, can be prevented reliably.

In addition, such removing processing of the removal-regions is carried out through plasma etching for dividing the semiconductor devices into individual pieces, and therefore, it is not necessary to add a separate process for removing them, and thus, an efficient process can be carried out.

According to the second aspect of the present invention, each of the removal-regions are small regions in comparison with each of the unit-device-formation-regions, such that the length dimension of segments which partition each of the removal-regions is shorter than that of the segments which partition each of the unit-device-formation-regions, and thereby, particles that relatively easily jump off can be removed reliably, by removing the removal-regions, and thus, problems such as jumping off of such pieces of the wafer can be effectively prevented.

According to the third mode, said mask is placed so as to expose the entirety of the imaginary-dividing-lines that have been arranged on the surface on the side on which the mask is placed, and thereby, the regions that are located so as to surround the unit-device-formation-regions in the semiconductor wafer and have not become either the unit-device-formation-regions or the removal-regions can be cut out along the dividing lines as individual divided pieces. As described above, the regions that are located so as to surround the unit-device-formation-regions, that is to say, the semiconductor devices, are not left as large lumps, and are left in a state where they are divided into individual pieces, and thereby, it becomes possible to smoothly expand the wafer sheet (adhesive sheet) when each of the semiconductor devices is picked up.

According to the fourth aspect of the present invention, all the regions that do not become the unit-device-formation-regions from among the imaginary-divided-regions are removed through the plasma etching as the removal-regions, and thereby, the portions other than the semiconductor devices in the semiconductor wafer can be completely removed, and thus, dividing process where no waste pieces are created can be implemented.

According to another aspect of the present invention, after such a dividing process for a semiconductor wafer has been carried out, ashing process is carried out, in order to remove the mask, and thereby, a manufacturing method for a semiconductor device according to which semiconductor devices are formed as individual pieces can be provided.

BRIEF DESCRIPTION OF THE DRAWINGS

These and other aspects and features of the present invention will become clear from the following description taken in conjunction with the preferred embodiments thereof with reference to the accompanying drawings, in which:

FIG. 4A is a view showing a semiconductor wafer in a state where semiconductor devices have been formed, FIG. 4B is a view showing the semiconductor wafer in a state where a protective sheet has been applied in the protective sheet applying process, FIG. 4C is a view showing the semiconductor wafer in a state where the polishing process is being carried out, and FIG. 4D is a view showing the semiconductor wafer in a state where the damaged layer removing process is being carried out;

FIGS. 5A to 5F are schematic explanatory views for explaining each procedure of the flow chart of FIG. 3;

FIG. 5A is a view showing the semiconductor wafer in a state where a mask layer has been formed in the mask layer forming process, FIG. 5B is a view showing the semiconductor wafer in a state where the mask removed portions for dividing lines and the mask removed portions for removal-regions to be removed have been formed in the mask layer partial-removing process, FIG. 5C is a view showing the semiconductor wafer in a state where etching is being carried out in the plasma dicing process, FIG. 5D is a view showing the semiconductor wafer in a state of being divided into pieces, each of which is a semiconductor device, FIG. 5E is a view showing the semiconductor wafer in a state where the mask has been removed in the mask layer removing process, and FIG. 5F is a view showing the semiconductor wafer in a state where a die bonding sheet has been applied to the semiconductor wafer;

DETAILED DESCRIPTION OF THE INVENTION

Figure 1:
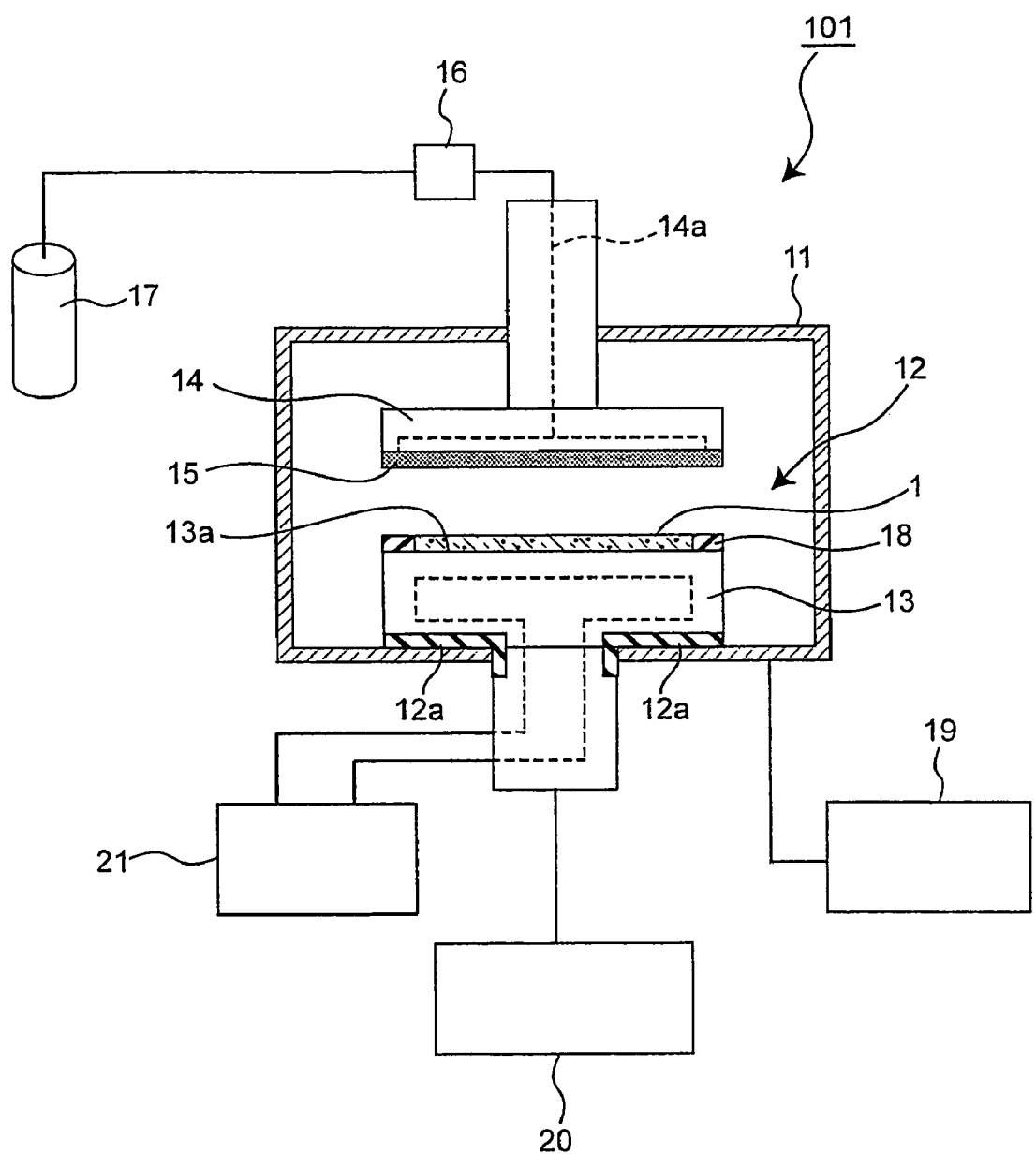
FIG. 1 is a schematic configuration diagram showing a plasma processing apparatus that is used in a manufacturing process for semiconductor devices according to one embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

A method for dividing a semiconductor wafer and a manufacturing method for a semiconductor device according to one embodiment of the present invention are described below. The configurations of apparatuses that are used in the method for dividing a semiconductor wafer and the manufacturing method for a semiconductor device are first described.

FIG. 1 is a diagram that schematically shows the configuration of a plasma processing apparatus 101, which is an example of a semiconductor wafer dividing unit in accordance with the method for dividing a semiconductor wafer of the present embodiment. This plasma processing apparatus 101 is an apparatus for performing a plasma etching process on a semiconductor wafer where a plurality of semiconductor devices have been formed, and thereby, a dividing process (plasma dicing process) is performed on the semiconductor wafer, which is divided into individual pieces of the semiconductor devices. First, a schematic configuration of this plasma processing apparatus 101 is described below with reference to FIG. 1.

As shown in FIG. 1, the plasma processing apparatus 101 has a vacuum chamber 11 that includes a processing chamber 12 for applying plasma processing to a semiconductor wafer 1. Inside the vacuum chamber 11, a lower electrode 13 and an upper electrode 14 are disposed in parallel so as to face each other. Moreover, on the upper face of the lower electrode 13, as viewed in the drawing, includes a placing face 13a on which an almost disc-shaped semiconductor wafer 1 can be mounted. The semiconductor wafer 1 is mounted on the placing face 13a in the state in which the entire periphery thereof is surrounded by an insulating ring 18. Moreover, the placing face 13a functions to suck and hold the mounted semiconductor wafer 1 in a releasable way through vacuum suction or electrostatic suction. The lower electrode 13 is disposed inside the processing chamber 12 through an insulator 12a, with the lower electrode 13 and the processing chamber 12 being electrically insulated through the insulator 12a.

Moreover, in the upper electrode 14, a gas supply hole 14a, which is a passage for supplying plasma generation gas to the inside of a space (electric discharge space) formed between the upper electrode 14 and the lower electrode 13, is formed in such a way as to go through the inside of the upper electrode 14. Moreover, one end of the gas supply hole 14a in the upper electrode 14 is linked to the outside of the vacuum chamber 11 and connected to a plasma generation gas supply unit 17 provided outside of the vacuum chamber 11. This arrangement makes it possible to supply, for example, a fluorinated plasma generation gas from the plasma generation gas supply unit 17 to the processing chamber 12 through the gas supply hole 14a. It is to be noted that, at some midpoint of the gas supply passage extending between the plasma generation gas supply unit 17 and the one end of the gas supply hole 14a, a flow regulating valve 16 is provided. The flow regulating valve 16 is operable to regulate the flow rate of the gas from the gas supply unit 17. Further, a porous plate 15 is seated on the lower surface of the upper electrode 14 as viewed in the drawing, which makes it possible to supply the plasma generation gas through the gas supply hole 14a to the inside of the processing chamber 12 so that the plasma generation gas is evenly sprayed to the semiconductor wafer 1 through the porous plate 15.

Moreover, the plasma processing apparatus 101 has a vacuum pump 19 exemplifying an evacuation apparatus for reducing the pressure in the processing chamber 12 to a desired pressure (i.e., vacuumizing the processing chamber 12) by evacuating the processing chamber 12. Moreover, an RF power supply unit 20 is electrically connected to the lower electrode 13, which makes it possible to apply high-frequency voltage to the lower electrode 13 from the RF power supply unit 20.

In the thus-structured plasma processing apparatus 101, after the semiconductor wafer 1 is mounted on the placing face 13a of the lower electrode 13 and the vacuum chamber 11 is enclosed, the processing chamber 12 is evacuated and vacuumized by the vacuum pump 19 and a high-frequency voltage is applied to the lower electrode 13 by driving the RF power supply unit 20 while a specified amount of the plasma generation gas is supplied to the processing chamber 12 from the plasma generation gas supply unit 17, by which fluorinated plasma is generated between the electric discharge space between the upper electrode 14 and the lower electrode 13. By exposing the surface of the semiconductor wafer 1 to thus-generated plasma, etching (i.e., plasma etching) of the exposed surface can be implemented. It is to be noted that the plasma processing apparatus 101 has a cooling unit 21 for cooling the semiconductor wafer 1 mounted on the placing face 13a of the lower electrode 13 through the placing face 13a by circulating a coolant inside the lower electrode 13. Thus, the presence of the cooling unit 21 makes it possible to prevent the temperature of the semiconductor wafer 1 from increasing beyond a specified temperature due to the heat generated during plasma processing.

Figure 2:
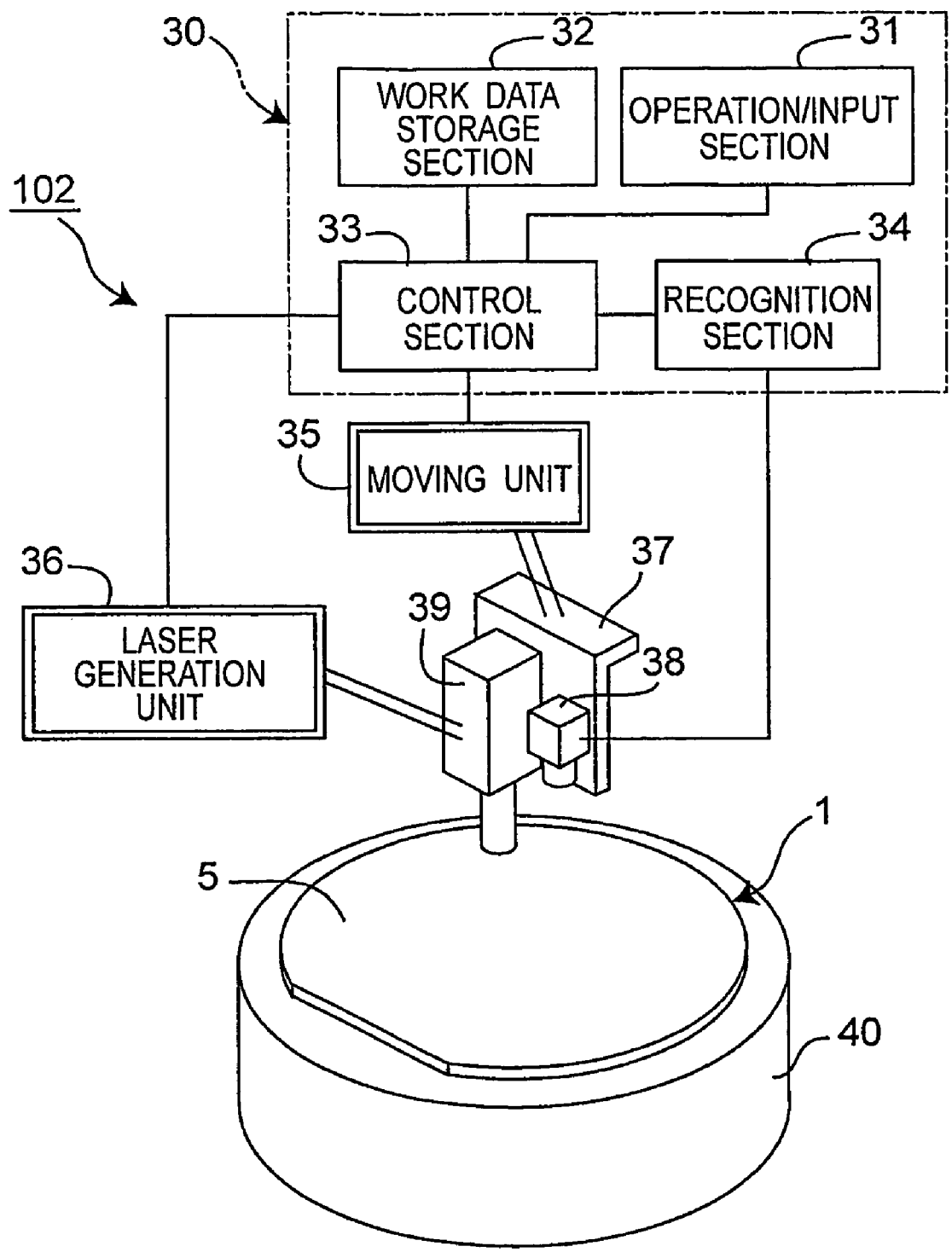
FIG. 2 is a schematic configuration diagram showing a laser processing apparatus that is used in the manufacturing process for the semiconductor devices according to the embodiment.

Description is now given of the structure of a laser processing apparatus 102 exemplifying the formation apparatus for semiconductor wafer dicing masks, in which, during plasma dicing by such a plasma processing apparatus 101, a mask layer placed on the surface of a semiconductor wafer 1 is processed with a laser beam along the dicing positions of respective semiconductor devices to form dicing lines, with reference to the schematic block diagram in FIG. 2.

As shown in FIG. 2, the laser processing apparatus 102 has a wafer holding unit 40 (wafer holding device) for holding the semiconductor wafer 1 having a mask layer 5 formed thereon. A moving plate moving head 37, which is equipped with a laser irradiation unit 39 and a camera 38, is provided on the wafer holding unit 40. Also, a moving apparatus (device) 35 for moving the moving plate moving head 37 relative to the wafer holding unit 40 is provided along the surface of the semiconductor wafer 1 while being held by the wafer holding unit 40. Thus, the moving apparatus 35 allows the laser irradiation unit 39 and the camera 38 to be moved relative to the wafer holding unit 40. Moreover, the laser irradiation unit 39 is capable of irradiating the laser beam generated by a laser generation unit 36 to the semiconductor wafer 1.

The camera 38 is an infrared camera for picking images of the semiconductor wafer 1 by infrared light. In this case, images of a circuit pattern or distinguishing marks on the circuit formation face of the semiconductor wafer 1 may be picked up through the mask layer 5. Then, the image pick-up result is inputted into a recognition section 34 included in a laser processing control unit 30 exemplifying a control device. Recognition processing is performed to detect the position and the circuit pattern arrangement of the semiconductor wafer 1.

Moreover, the laser processing control unit 30 comprises a control section 33 for controlling laser generation operation by the laser generation unit 36, moving operation by the moving apparatus 35 and recognition processing by the recognition section 34, an operation/input section 31 for operating and commanding the control by the control section 33, and a work data storage section 32 for storing data which is referred during control operation by the control section 33. The work data storage section 32 stores data on dicing positions (dicing lines or parting lines) of respective semiconductor devices on the semiconductor wafer 1 and data on the width of the dicing lines formed at the dicing positions (dicing width), i.e., the removal width of the mask layer removed along the dicing positions. Data written onto the work data storage section 32 is executable by the operation/input section 31.

When laser processing of the semiconductor wafer 1 is executed in the laser processing apparatus 102 having such structure, the control section 33 controls the moving apparatus 35 based on actual position data of the semiconductor wafer 1 detected by the recognition section 34 and the dicing position data stored in the work data storage section 32. With this, the moving apparatus 35 makes it possible to move the laser irradiation unit 39 along the dicing positions on the upper face of the semiconductor wafer 1. Further, by the control section 33 controlling the laser generation unit 36 based on the data on the width of the dicing lines, it becomes possible to irradiate a laser beam with an output appropriate for removing the mask layer 5 with a removal width corresponding to the width of the dicing lines from the laser irradiation unit 39. By executing such laser processing, it becomes possible to form a mask pattern with only a portion, corresponding to the dicing lines for separating the semiconductor devices from each other, being removed in the mask layer 5 on the surface of the semiconductor wafer 1.

Figure 3:
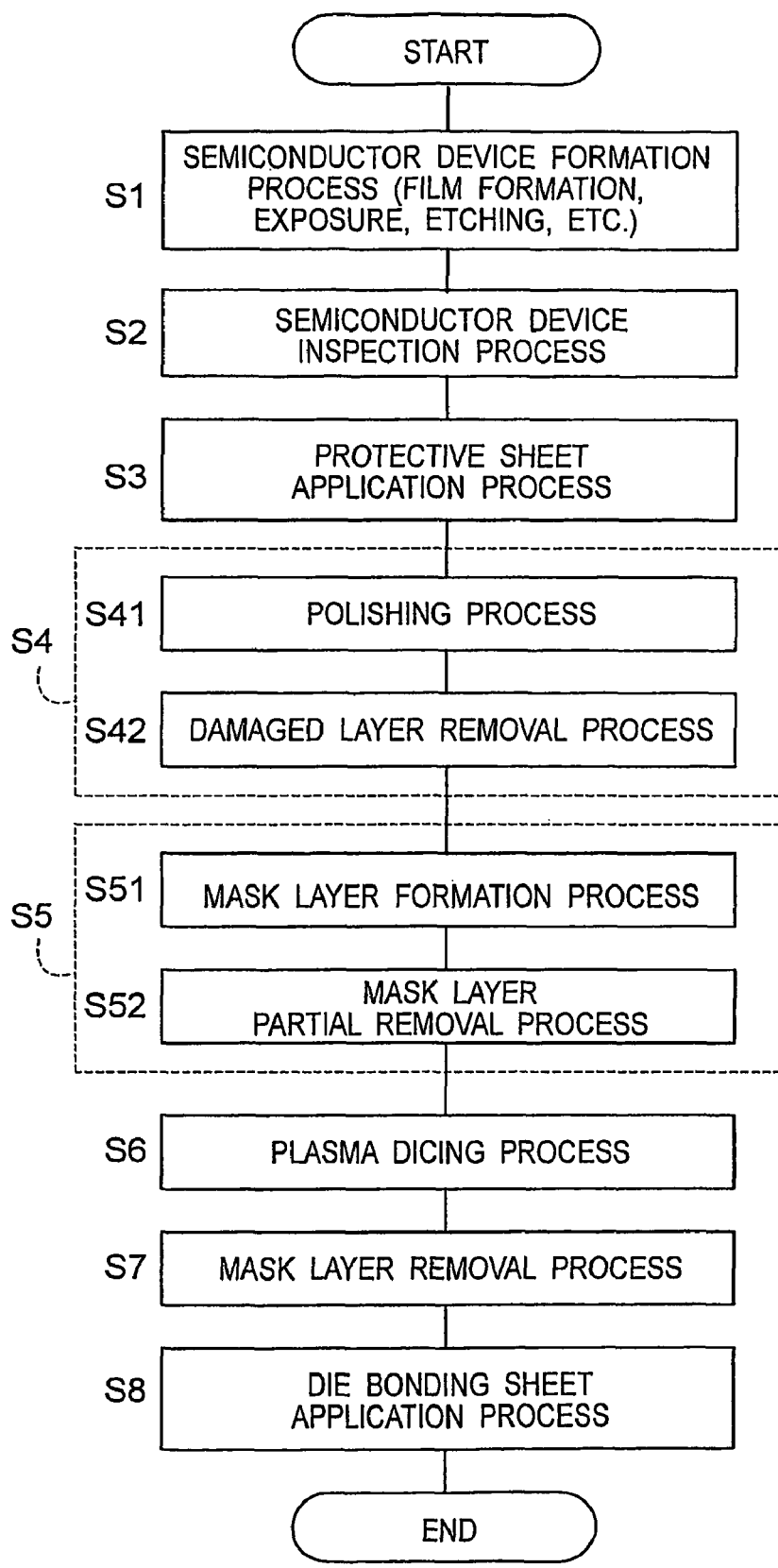
FIG. 3 is a flowchart showing the procedures of the manufacturing process for the semiconductor devices according to the above-described embodiment.

Description is now given of a series of the manufacturing processes of respective semiconductor devices including the dicing of the semiconductor wafer 1 performed with use of the thus-structured laser processing apparatus 102 and the plasma processing apparatus 101. FIG. 3 shows a flowchart showing the procedures in the manufacturing process of the semiconductor devices, and FIGS. 4A, 4B, 4C, 4D, 5A, 5B, 5C, 5D, 5E and 5F show schematic explanatory views for explaining the procedures of the manufacturing process.

Figure 4A:
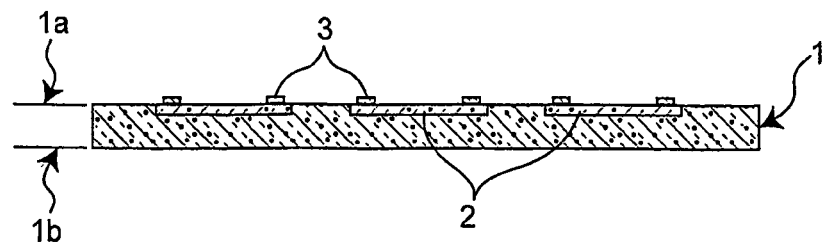
FIGS. 4A to 4D are schematic explanatory views for explaining each procedure of the flowchart of FIG. 3.

First, in step S1 in the flowchart of FIG. 3, the processing such as film formation, exposure and etching is applied to a circuit-formation-face 1a that is a first surface of the semiconductor wafer 1 to form a plurality of circuit formation portions 2 which become semiconductor devices as shown in FIG. 4A (semiconductor device formation process). Further, in each of the circuit formation portions 2, a plurality of external connection electrodes 3 are formed from conductive materials that are exposed from the circuit-formation-face 1a.

Next, in order to determine whether or not the semiconductor wafer 1, having respective circuit formation portions 2 and the external connection electrodes 3 formed thereon, has any defect portions during the formation state, the formation states of the respective circuit formation portions 2 and the external connection electrodes 3 are inspected (semiconductor device inspection process, step S2). In this inspection, it is mainly inspected whether or not the circuit formation portions 2 and the external connection electrodes 3 have any defects in their electric characteristics. Based on the result of the inspection, the quality check is performed by every circuit formation portion 2, and with respect to those circuit formation portions 2 that are determined to be flawed, their position information on the semiconductor wafer 1 is formed and stored. Such position information may be stored in a storage device included in the inspection apparatus for performing the inspection or may be stored in a storage device included in a management system for managing the entire manufacturing process of semiconductor devices and the like. The type of the storage configuration may take various forms as long as the position information is stored so as to be accessible in the following processes. Further, the position information is created and maintained, not only in the case of the position information for those circuit formation portions 2 determined to be flawed, but in the case of the position information for the circuit formation portions 2 determined, on the contrary, to be acceptable, so that the acceptable circuit formation portions 2 may be distinguished from the flawed circuit' formation portions 2.

Figure 4B:
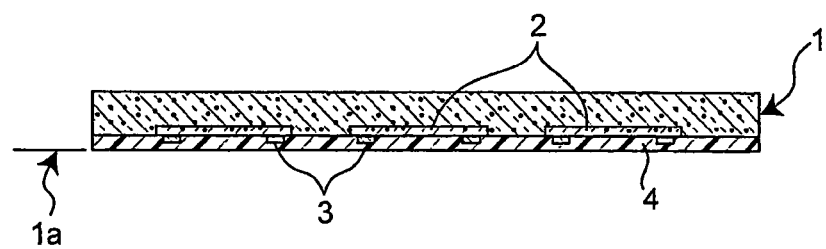

Next, as shown in FIG. 4B, a protective sheet 4 is applied to the circuit-formation-face 1a through an adhesive agent so as to prevent the circuit-formation-face 1a of the semiconductor wafer 1, after completion of the inspection process, from being damaged during subsequent processing operations (protective sheet application process, step S3). It is to be noted that the protective sheet 4 is formed into almost the same shape as the external shape of the semiconductor wafer 1 so as to cover the entire circuit-formation-face 1a and not to protrude outward from the end portions of the semiconductor wafer 1. By using the protective sheet 4 in this manner, it becomes possible to prevent damage during the following processes such as plasma processing, where protective sheet protruding from the semiconductor wafer 1 would be burnt by plasma.

Figure 4C:
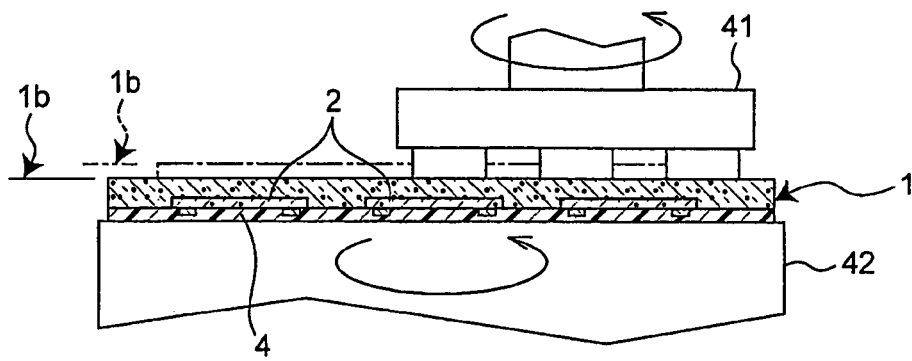

Next, in step S41 in FIG. 3, a polishing process for thinning the thickness of the semiconductor wafer 1 is performed. More specifically, as shown in FIG. 4C, with the circuit-formation-face 1a of the semiconductor wafer 1 being on the lower side as viewed in the drawing, the semiconductor wafer 1 is placed on a holding table 42 through the protective sheet 4 and the placing position is held. In this state, a processing-target-face 1b (second surface or mask placement-side surface on which a mask is placed in the following processes), which is a surface on the opposite side of the circuit-formation-face 1a of the semiconductor wafer 1, is polished by using a grinding wheel 41. On the lower face of the grinding wheel 41, as viewed in the drawing, a grinding stone is fixed, and the grinding stone is rotated along the processing-target-face 1b of the semiconductor wafer 1 while in contact with the surface to perform polishing of the processing-target-face 1b. By such polishing treatment, the semiconductor wafer 1 is thinned to a thickness of about 100 μm or smaller, e.g., 50 μm in the present embodiment.

Figure 4D:
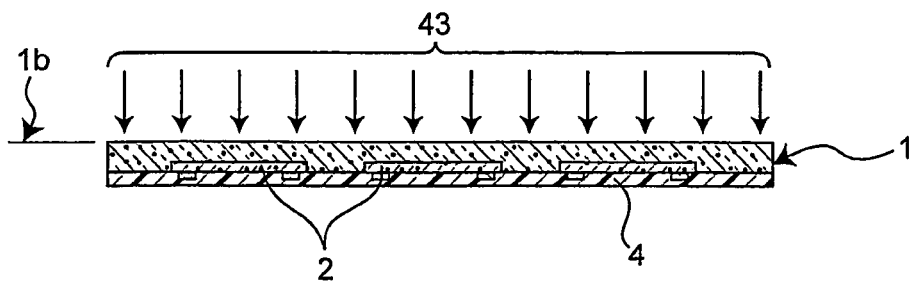

In the vicinity of the surface of the processing-target-face 1b of the semiconductor wafer 1 subjected to the polishing process, a damaged layer retaining stress imparted by polishing with the grinding wheel 41 is formed. Such a damaged layer being left on the formed semiconductor devices degrades the resistance of the semiconductor devices, and causes deterioration of their quality. In order to prevent such deterioration of the quality, the damaged layer formed on the processing-target-face 1b of the semiconductor wafer 1 is removed as shown in FIG. 4D (damaged layer removal process, step S42). For example, as shown in FIG. 4D, an etching solution (sulfuric acid, nitric acid, phosphoric acid, fluorinated acid, etc.) 51 is brought into contact with the damaged layer formed on the processing-target-face 1b of the semiconductor wafer 1 so as to remove the damaged layer by corroding the damaged layer by the chemical reaction (wet etching treatment). It is to be noted that instead of using the wet etching treatment as the removal processing of the damaged layer, the damaged layer may be removed by applying plasma etching to the processing-target-face 1b (plasma etching process), or the damaged layer may be removed by performing polishing on the processing-target-face 1b. Moreover, the process combining the polishing process in step S41 and the damaged layer removal process in step S42 constitutes the thinning process in step S4.

After such a thinning process is applied, as shown in FIG. 5, a mask layer 5 is formed on the processing-target-face 1b of the semiconductor wafer 1 (mask layer formation process, step S51). The mask layer 5 is for forming mask patterns for use in the later-described plasma dicing process, the mask pattern being formed from a material, such as aluminum and resin, having tolerance against plasma produced with the use of fluorinated gasses.

In the case of using aluminum, a method for forming an aluminum thin film on the processing-target-face 1b by deposition and a method for applying a foil-like aluminum thin film are used. In the case of using resin, a method for applying a resin formed in a film shape and a method for coating the processing-target-face 1b with a liquid resin by a spin coat method and the like may be used.

Figure 5A:
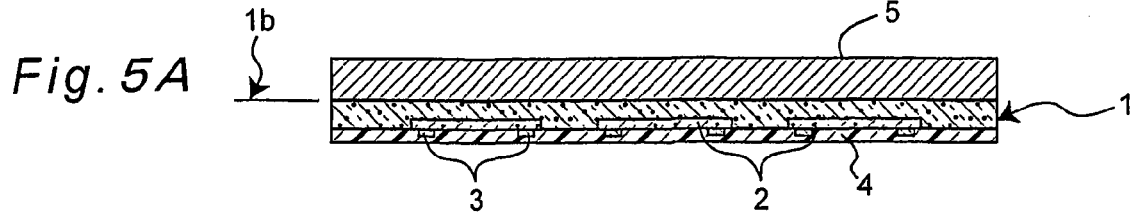
Figure 5B:
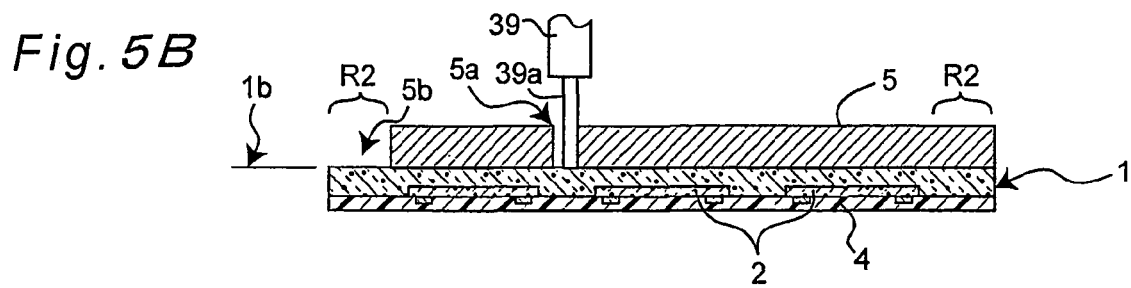

Next, as shown in FIG. 5B, partial removal of the mask layer 5 by laser processing is performed (mask layer partial removal process, step S52). More specifically, in the laser processing apparatus 102 shown in FIG. 2, the semiconductor wafer 1, having the mask layer 5 formed on the processing-target-face 1b, is placed on the wafer holding unit 40 through the protective sheet 4 which is applied to the circuit-formation-face 1a, and the placing position is held. After that, while the camera 38 is moved by the moving apparatus 35 along the surface of the semiconductor wafer 1, an image of the circuit patterns of the semiconductor wafer 1 is obtained. By performing recognition processing of the obtained image in the recognition section 34, the actual position of the semiconductor wafer 1 is recognized. The control section 33 controls the moving apparatus 35 based on the result of the recognition processing and the position data on the dicing positions (positions of the dicing lines) stored in the work data storage section 32, and moves the laser irradiation unit 39 along the dicing positions of the semiconductor wafer 1. While moving the laser irradiation unit 39, the control section 33 controls the laser generation unit 36 based on the dicing line width data, and irradiates a laser beam with an output appropriate for removing the mask layer 5 with a removal width corresponding to the width. With such irradiation of the laser beam 39a, a dicing mask removed portion 5a, where the mask layer 5 is partially removed, is formed at the dicing positions of the respective semiconductor devices as shown in FIG. 5B.

Here, a method for determining the above described dividing lines (dividing positions) on the semiconductor wafer 1, that is to say, a method for determining the arrangement of the respective semiconductor devices are described in detail. For the purpose of this description, FIG. 6 shows a schematic plan diagram of the semiconductor wafer 1.

Figure 6:
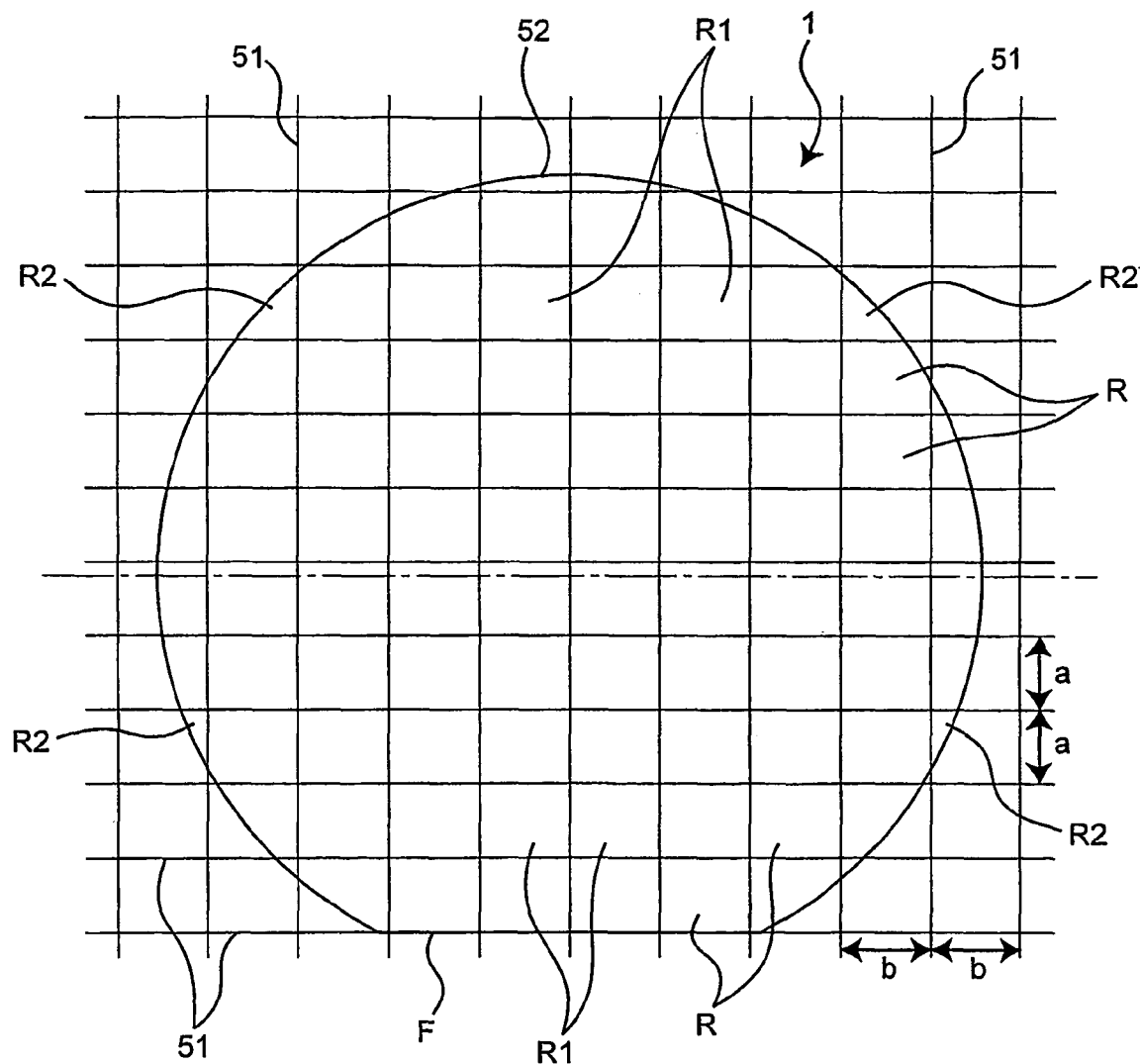
FIG. 6 is a schematic explanatory views for explaining a method for partitioning the imaginary-divided-regions in the semiconductor wafer, which shows a state where the respective imaginary-dividing-lines are arranged in a grid-like arrangement.

As shown in FIG. 6, the semiconductor wafer 1 has an outer shape that is nearly circular, and an orientation flat F which is an end portion that is linear shape and is formed at the bottom end portion in the figure. A plurality of imaginary-dividing-lines 51, which are imaginary straight lines, are arranged in a grid-like arrangement on the semiconductor wafer 1, as shown in FIG. 6. Thereby, the surface on the semiconductor wafer 1 is partitioned into a plurality of regions with the respective imaginary-dividing-lines 51, the circumferential line 52 which is the peripheral outline of the semiconductor wafer 1 and the orientation flat F. Here, the regions that are sectioned in this manner are referred to as imaginary-divided-regions R.

Specifically, as shown in FIG. 6, the imaginary-dividing-lines 51 are arranged at a predetermined pitch, and in directions which are perpendicular to each other. Some of the imaginary-dividing-lines 51 are arranged at a pitch "a" in the direction that is, for example, parallel to the orientation flat F, and the rest of the imaginary-dividing-lines 51 are arranged at a pitch "b" in the direction that is perpendicular to the orientation flat F, and thereby, the semiconductor wafer 1 is partitioned into a plurality of the imaginary-divided-regions R.

The regions in rectangular form which are partitioned only with the imaginary-dividing-lines 51 without including the circumferential line 52 from among the imaginary-divided-regions R are assumed to be unit-device-formation-regions R1. These unit-device-formation-regions R1 are regions in rectangular form having a dimension of "a" in the longitudinal direction and a dimension of "b" in the lateral direction, and are regions where circuit formation portions 2 are formed. Accordingly, it is preferable to determine the arrangement of the imaginary-dividing-lines 51 in such a manner that the maximum number of unit-device-formation-regions R1 can be acquired from one semiconductor wafer 1. Here, such a determination of the arrangements can be made using a semiconductor device arrangement determining apparatus including, for example, a computer, an operational program, and the like, and the arrangement that has been determined in this manner can be used as arrangement data in the semiconductor device manufacturing processes. Accordingly, the respective circuit formation portions 2 are formed on the basis of arrangement data of the respective unit-device-formation-regions R1 that have been partitioned with the respective imaginary-dividing-lines 51 in the semiconductor device formation process (step S1) in the flowchart of FIG. 3.

Meanwhile, the imaginary-divided-regions R that have been partitioned in the semiconductor wafer 1 include regions other than the unit-device-formation-regions R1. From among these regions, regions having a nearly triangular shape that have been partitioned with two imaginary-dividing-lines 51 that are perpendicular to each other and the circumferential line 52 are assumed to be removal-regions R2. These removal-regions R2 are the regions that are removed from the semiconductor wafer 1 in the plasma dicing process described below.

Figure 7:
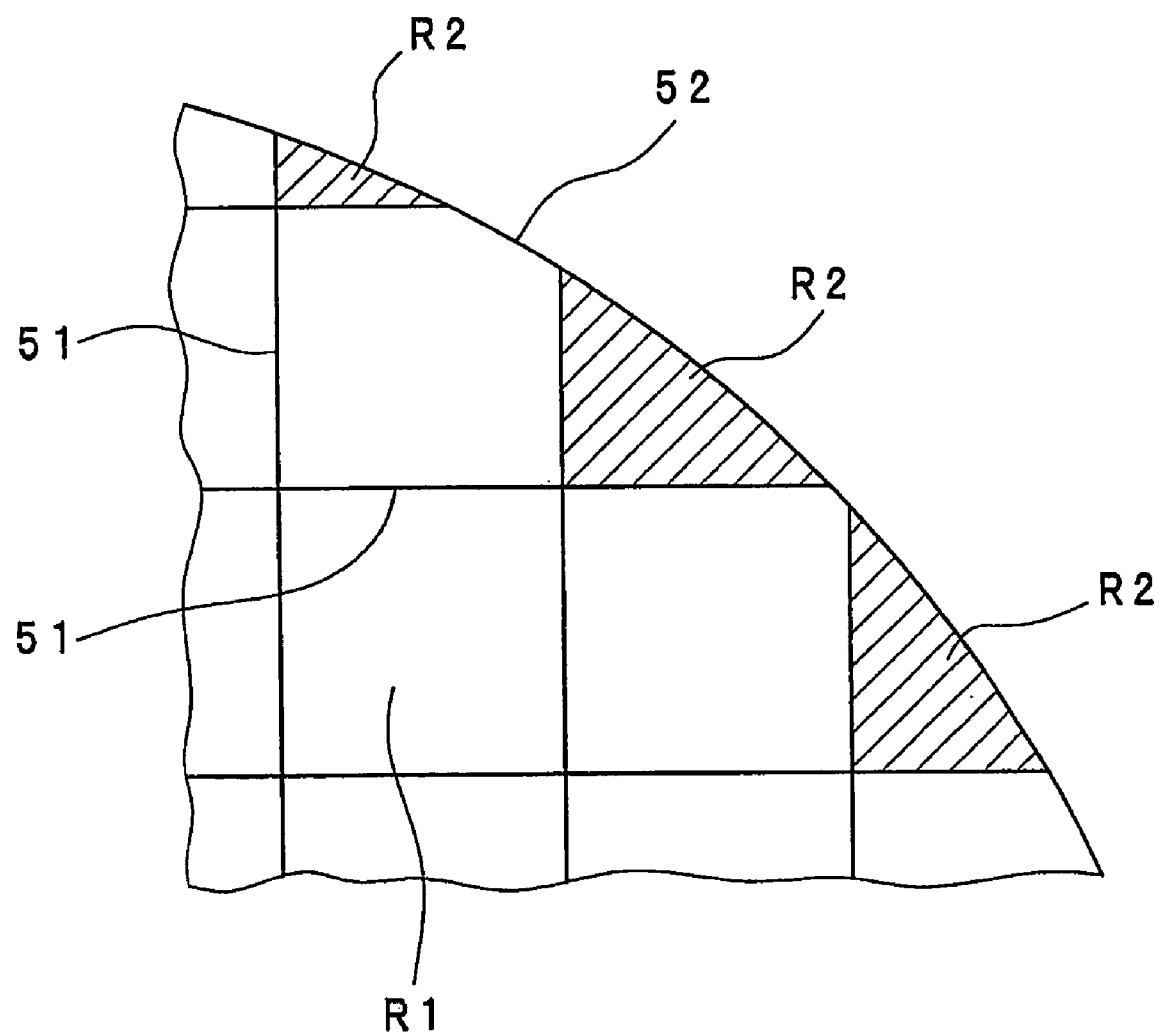
FIG. 7 is a schematic diagram showing removal-regions to be removed in the semiconductor wafer.

Here, these removal-regions R2 are described in detail with reference to the enlarged schematic diagram of FIG. 7, which shows a part of the semiconductor wafer 1. As shown in FIG. 7, in the vicinity of the circumferential line 52 of the semiconductor wafer 1, there are imaginary-divided-regions R that are not included in the unit-device-formation-regions R1. From among these regions, regions nearly triangular in shape (regions shown with hatching in FIG. 7) that are defined by the circumferential line 52 as its imaginary hypotenuse (regarded as a straight line) and two imaginary-dividing-lines 51 that are perpendicular to each other as the other two sides of the triangle are the removal-regions R2. The lengths of the respective line segments (sides) that are defined by the above described two imaginary-dividing-lines 51 in the removal-regions R2 are respectively shorter than the lengths "a" and "b" of one line segment of the unit-device-formation-regions R1. In addition, some of the imaginary-divided-regions R, other than the removal-regions R2, are not included in the unit-device-formation-regions R1, and such regions are defined by four or more sides with a relatively large area in comparison with the regions to be removed R2 which are regions that are nearly triangular in shape.

In addition, arrangement data on such removal-regions R2 is prepared, together with arrangement data on, for example, the respective unit-device-formation-regions R1, and stored so that it can be outputted so as to be utilized in the process described below. Here, as shown in FIG. 6, the arrangement of the imaginary-dividing-lines 51 is inputted into the laser processing apparatus 102 as the position data on the dividing lines, and thus, the mask layer partial-removing process is performed.

In addition, the arrangement data on the respective removal-regions R2 that has been prepared as a result of the above-described arrangement determination has been inputted into the work data storage section 32 of the laser processing apparatus 102 through the operation/input section 31. Such position information can be inputted via wireless communication means, wired communication means or storage media. At the time of the process for removing the portions of the mask layer 5 along the dividing lines, the control section 33 controls the moving apparatus 35, the laser generation unit 36 and the laser irradiation unit 39 on the basis of the arrangement data of the removal-regions R2 that is stored in the work data storage section 32. The portions of the mask layer 5 that have been arranged in the respective removal-regions R2 are exposed with laser beam 39a, and thus, the portions of the mask layer 5 are removed so as to expose the entirety of the processing-target-faces 1b of the semiconductor wafer 1 in the removal-regions R2. As a result, mask removed portions 5b for the removal-regions are formed on the regions that correspond to the respective removal-regions R2 in the mask layer 5.

More specifically, in the semiconductor wafer 1 shown in FIG. 5B, in the case where the respective regions in the vicinity of the two end portions left and right in the figure, are regions to be removed R2, the entirety of the mask layer 5 that is arranged on the processing-target-face 1b on the semiconductor wafer 1 in the respective removal-regions R2 is removed so as to expose the entirety of the processing-target-face 1b.

Figure 8:
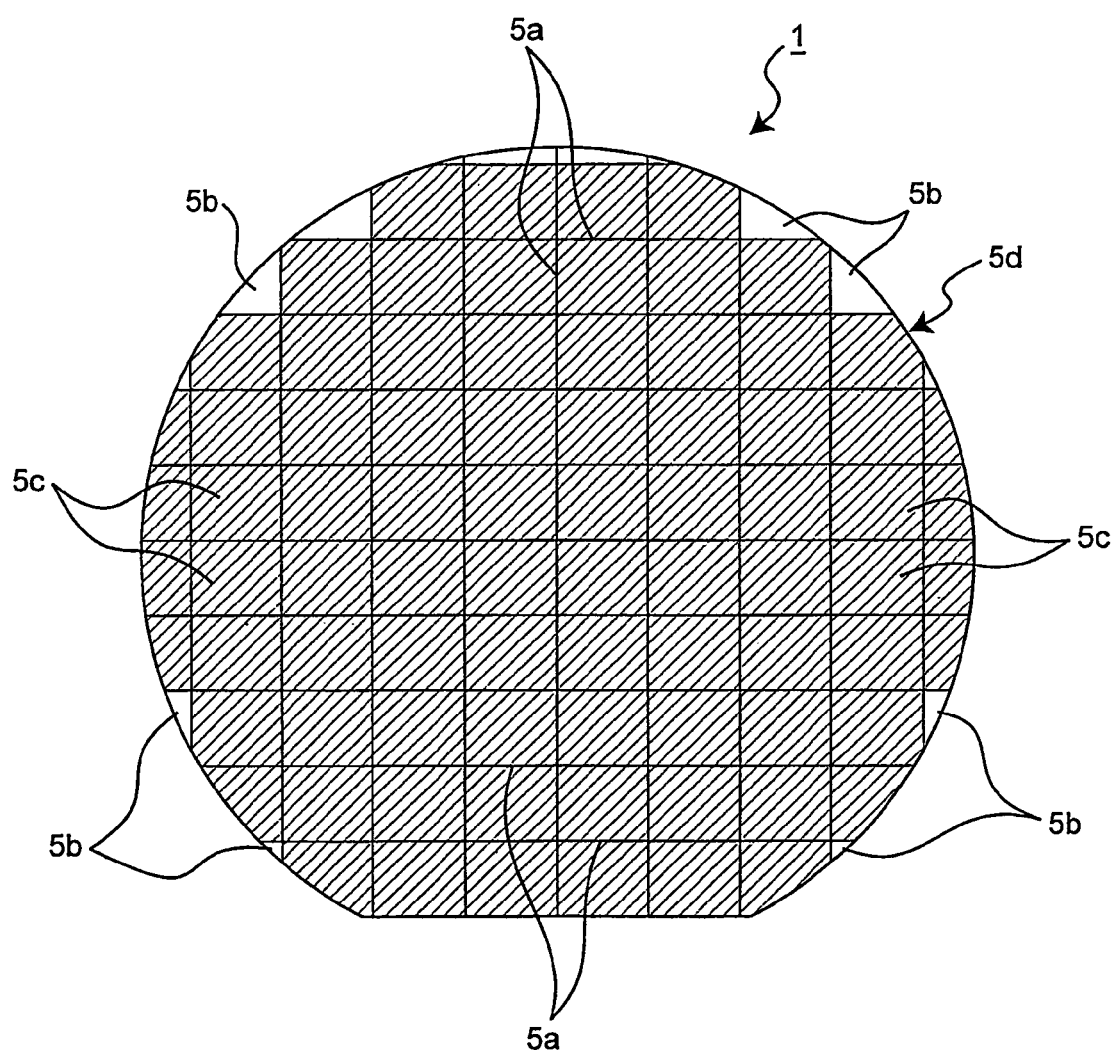
FIG. 8 is a schematic plan diagram showing the semiconductor wafer where a mask pattern, in a state where the mask layer has been partially removed, is formed.
Figure 9:
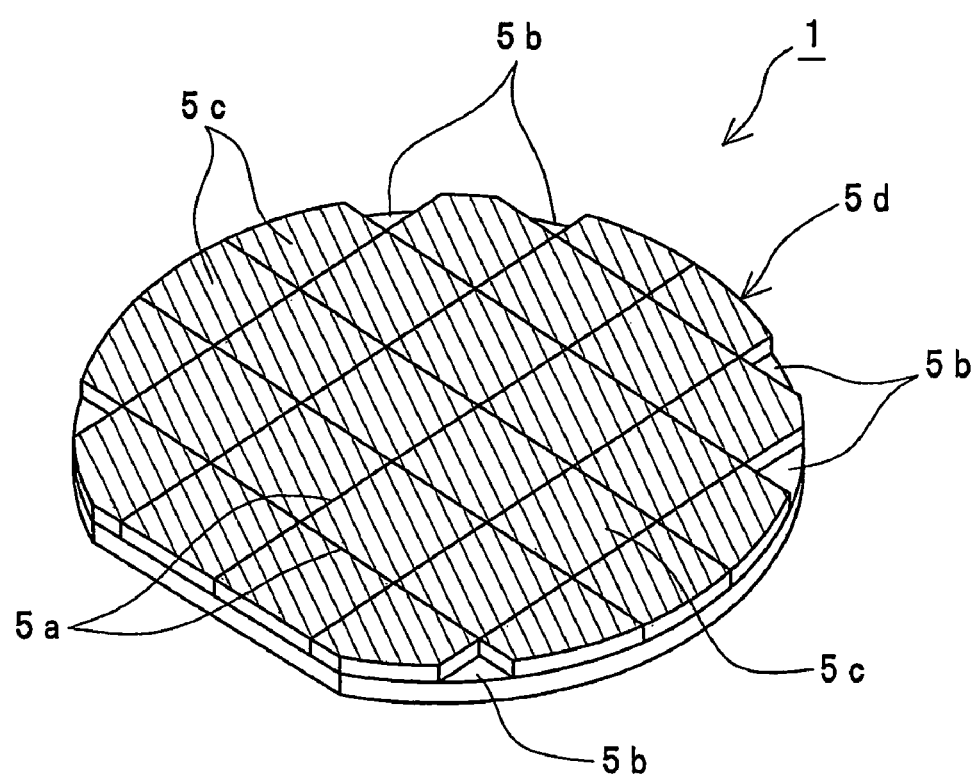
FIG. 9 is a schematic perspective diagram of the semiconductor wafer of FIG. 8.

FIG. 8 is a schematic plan diagram showing the semiconductor wafer 1 in a state where the portions of the mask layer 5 have been removed in the above-described manner. In addition, FIG. 9 is a schematic perspective diagram showing the semiconductor wafer 1 of FIG. 8. Here, the dividing lines on the semiconductor wafer 1 are simplified in FIG. 9.

As shown in FIGS. 8 and 9, the mask layer 5 that has been arranged on the processing-target-faces 1b of the semiconductor wafer 1 has mask patterns 5d where the mask removed portions 5a for the dividing lines, the mask removed 5b for the removal-regions and the mask portions 5c where the mask layer 5 remains without being removed. In this state, the processing-target-faces 1b of the semiconductor wafer 1 that correspond to the respective dividing lines are exposed through the respective mask removed portions 5a for the dividing lines, and at the same time, the processing-target-faces 1b of the semiconductor wafer 1 that correspond to the respective removal-regions R2 are exposed through the respective mask removed portions 5b.

Next, plasma etching is performed on the semiconductor wafer 1 where the mask patterns 5d have been formed as described above, and thereby, a process for dividing into the pieces of semiconductor devices is performed (plasma dicing process, step S6).

More specifically, in the plasma processing apparatus 101 shown in FIG. 1, a semiconductor wafer 1 is placed on the placing face 13a of the lower electrode 13 via the protective sheet 4, with the processing-target-face 1b on which the mask patterns 5d have been formed as the upper surface. After that, the vacuum chamber 11 is enclosed and the inside of the processing chamber 12 is vacuumed by driving the vacuum pump 19 (e.g., vacuumed to approx 100 Pa), and at the same time, a gas of which the flow amount has been adjusted by means of the flow regulating valve 16 is supplied from the plasma generation gas supply unit 17 to the inside of the processing chamber 12 through the gas supply hole 14a and the porous plate 15. In such a state, a high-frequency voltage is applied to the lower electrode 13 by means of the RF power supply unit 20, and thereby, plasma can be generated in the electric discharge space between the upper electrode 14 and the lower electrode 13.

As shown in FIG. 5C, the mask patterns 5d that have been formed on the processing-target-face 1b of the semiconductor wafer 1 in a state of being placed on the placing face 13a of the lower electrode 13 is exposed to plasma 61 that has been generated in the above described discharge space. As a result of this exposure with plasma 61, the mask removed portions 5a for the dividing lines, which are exposed surfaces on which the mask 5c is not placed, and the processing-target-faces 1b, which correspond to the mask removed portions 5b, are exposed to plasma 61. Etching is performed on the exposed processing-target-face 1b through this exposure with the plasma.

Figure 5D:
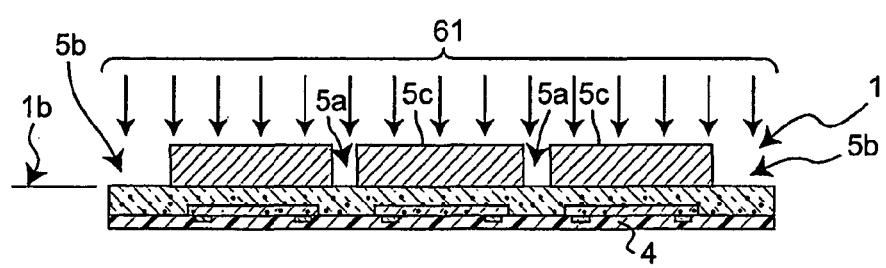
Figure 5D:
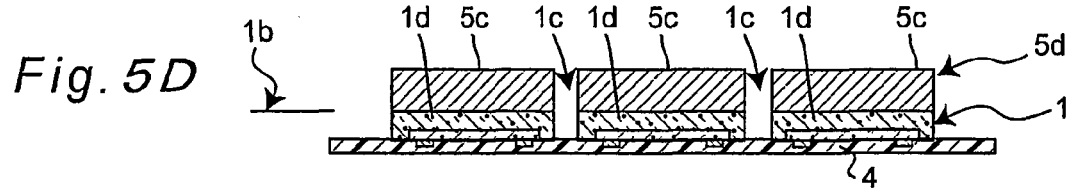

Plasma etching is performed on the exposed processing-target-faces 1b of the semiconductor wafer 1, and thereby, the thickness of the semiconductor wafer 1 is reduced at the portions that correspond to these exposed surfaces, and finally, these portions are removed and eliminated. As a result of this, as shown in FIG. 5D, the semiconductor wafer 1 is divided into the pieces of semiconductor devices 1d along dividing lines 1c, and at the same time, the portions of the semiconductor wafer 1 that correspond to the removal-regions R2 are removed at the respective mask removed portions 5b.

Figure 5E:
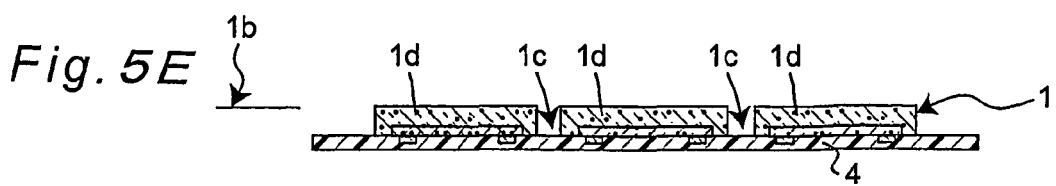
Figure 10:
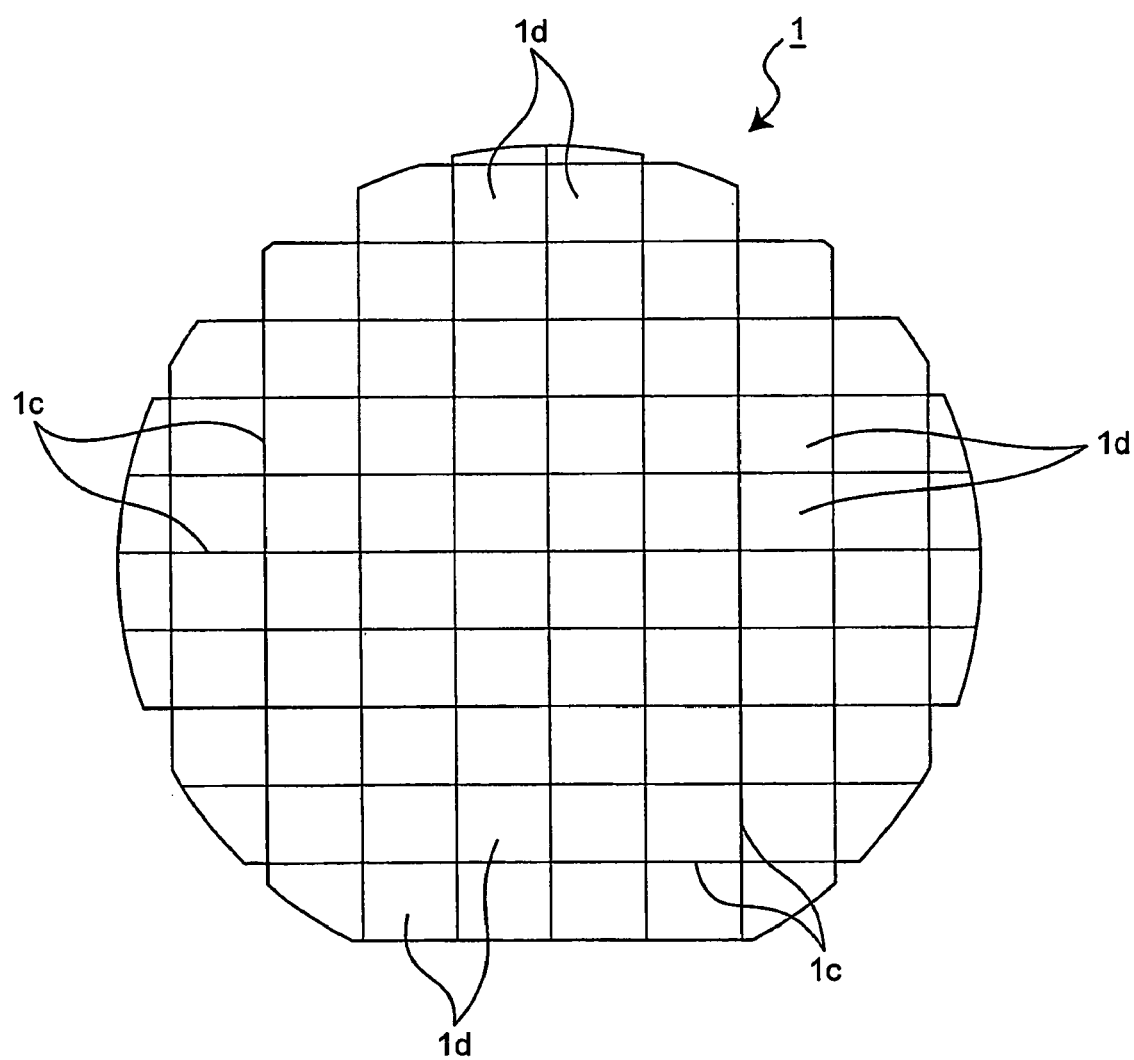
FIG. 10 is a schematic plan diagram showing a semiconductor wafer which has been divided into pieces, each of which is a semiconductor device, through plasma etching processing, and is in a state where the portions that correspond to the regions to be removed have been removed.

After that, as shown in FIG. 5E, pieces of the mask 5c that remain on the processing-target-faces 1b of the respective divided semiconductor devices 1d are removed by carrying out, for example, ashing processing (mask layer removing process, step S7). FIG. 10 is a schematic plan diagram showing the semiconductor wafer 1 on which this mask layer removing process has been performed. As shown in FIG. 10, the semiconductor devices 1d are divided into pieces, and in addition, pieces of the semiconductor wafer 1 are removed from the portions that correspond to the respective removal-regions R2. As a result of this, no pieces that are small regions in nearly triangular-like shape exist on the semiconductor wafer 1 on which the dividing process has been performed.

Figure 5F:
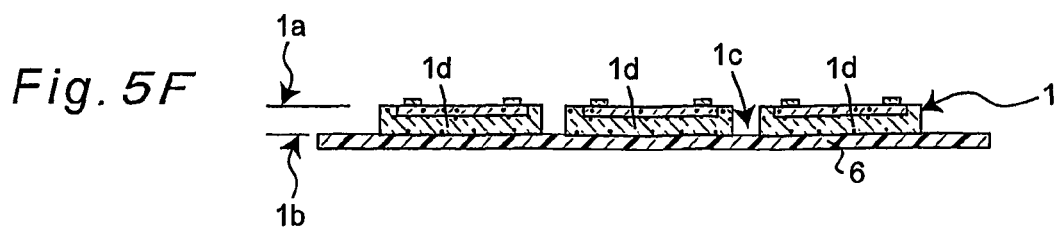

After that, as shown in FIG. 5F, an adhesive sheet (die bonding sheet) 6 is applied to the processing-target-face 1b of the semiconductor wafer 1 (die bonding sheet application process, Step S8), and at the same time, the protective sheet 4 that has protected the circuit-formation-surface 1a of the semiconductor wafer 1 is peeled off. Here, the adhesive sheet 6 has a size that is greater than that of the semiconductor wafer 1, and furthermore, is fixed by a wafer ring or jig (not shown) to the surroundings of the semiconductor wafer, and it becomes possible to handle the semiconductor wafer 1 by holding the wafer ring. The semiconductor device manufacturing processes are completed as described above.

The circuit-formation-surface 1a of each of the semiconductor devices 1d is sucked and held by, for example, a suction nozzle, and the suction nozzle is raised in this state, and thereby, the semiconductor device 1d sucked and held by the suction nozzle can be peeled from the adhesive sheet 6 so as to be taken out (picked up). At the time of suction and taking out by means of a suction nozzle as described above, images of the circuit-formation-surface 1a of the semiconductor devices 1d are acquired by an imaging device, and a recognition process is performed on these images, and thereby, the semiconductor device 1d is specified.

In addition, when the semiconductor device 1d is picked up in this manner, a so-called expanding operation where the adhesive sheet 6 that has been made to adhere to the semiconductor wafer 1 is expanded so as to radiate outward is carried out. The expanding operation forms gaps between adjacent semiconductor devices 1d, and such formation of gaps can prevent the semiconductor devices 1d from interfering with an adjacent semiconductor device 1d that is being picked up, and thus, the semiconductor device 1d can be picked up reliably.

Furthermore, in some cases, vibration is generated in the adhesive sheet 6 when an expanding operation is performed on the adhesive sheet 6, or at the time of picking up, as described above. Even in the case where such vibration is generated, the portions that correspond to the removal-regions R2 are removed from the semiconductor wafer 1 on which the dividing process has been performed, so that small pieces are not created, and therefore, the problem that occurs in the prior art, where small pieces jump off, can be prevented reliably.

Furthermore, small pieces can be removed, as described above, by performing a plasma dicing process using the mask removed portions 5b for the removal-regions that have been formed together with the mask removed portions 5a for the dividing lines which define the dividing lines in the process of forming the mask patterns. Accordingly, it is not necessary to perform an additional process specifically for the removal of such small pieces, and the semiconductor device manufacturing processes can be efficiently carried out.

In addition, the respective removal-regions R2, which are regions in nearly triangular-like form, are regions that are not adjacent to the unit-device-formation-regions R1 via the imaginary-dividing-lines 51, and thereby, even in the case where the mask removed portions 5b for the removal-regions that correspond to the respective removal-regions R2 in the mask layer 5 are formed, in this state, mask removed portions 5a for the dividing lines are inevitably formed on the four sides of the respective semiconductor devices 1a. Plasma etching is carried out in a state where the mask removed portions 5a for the dividing lines are formed between each pair of the adjacent semiconductor devices on the semiconductor wafer 1, in spite of the formation of the mask removed portions 5b for the removal-regions, and thereby, the etching conditions can be maintained approximately uniform. Accordingly, plasma dicing can be carried out under uniform conditions, and high quality semiconductor devices can be manufactured.

Figure 11:
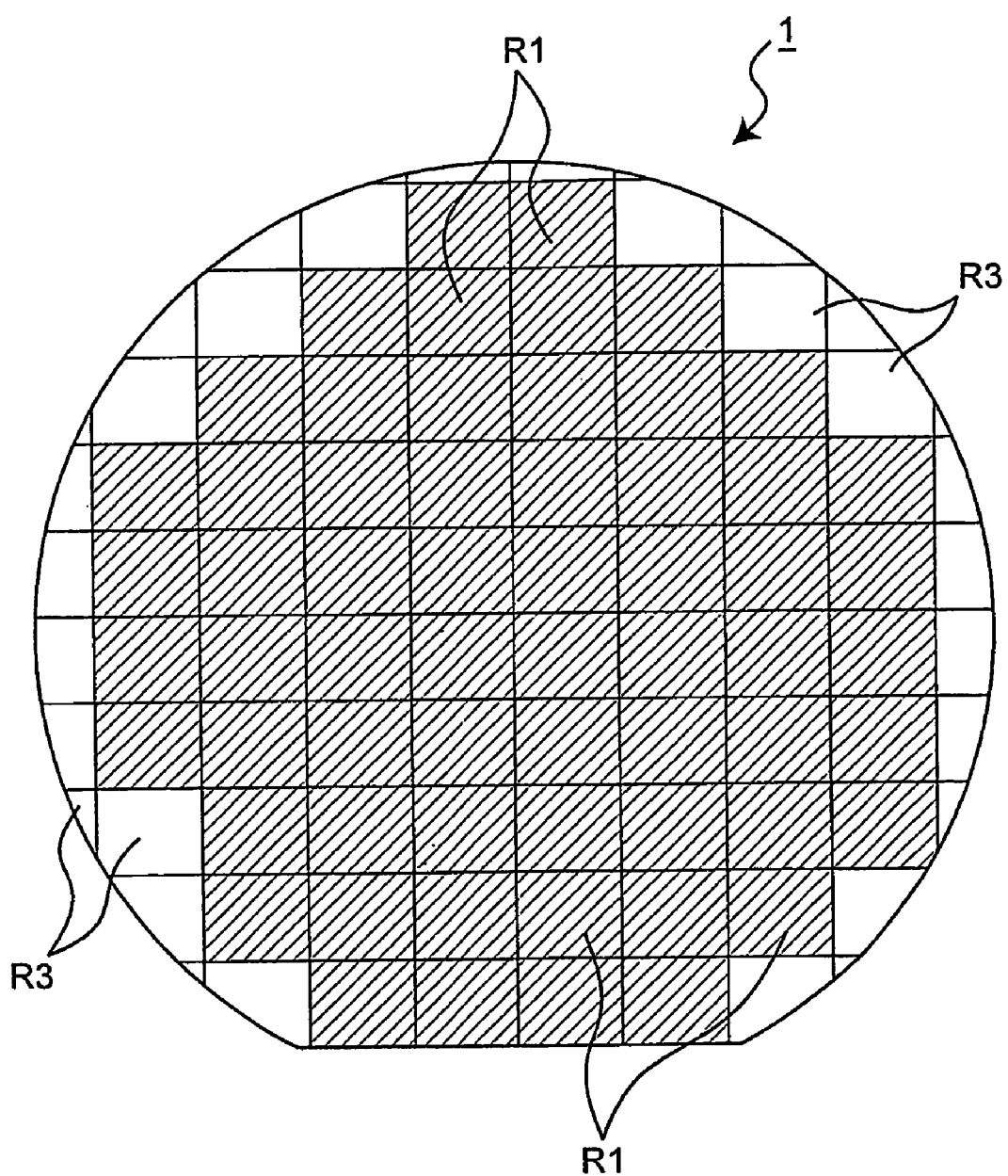
FIG. 11 is a schematic diagram showing a dividing method according to a modification of the above described embodiment, and is a schematic plan diagram showing the semiconductor wafer in a state where a mask pattern, for removing all of the regions that do not become the unit-device-formation-regions, has been arranged on the semiconductor wafer.

Here, although the nearly triangular-like form regions are assumed to be the removal-regions R2, and portions of the semiconductor wafer 1 that correspond to these removal-regions R2 are removed, the present embodiment is not limited to such a case. Instead of such a case, it may be the case, as shown in FIG. 11, for example, that all of the regions (regions that include the removal-regions R2) that do not become the unit-device-formation-regions R1 from among the respective imaginary-divided-regions R are assumed to be removal-regions R3, and the mask patterns 5d, where all of these removal-regions R3 are removed in the plasma dicing process (S6), are used. In such a case, the semiconductor wafer 1 is divided into individual pieces of the semiconductor devices 1d by carrying out the plasma dicing process, and at the same time, all portions of the semiconductor wafer 1 that do not become the semiconductor devices 1d can be removed.

Unnecessary portions of the semiconductor wafer 1 can be completely removed as a result of the above described removal process, and in the pick-up operation of the respective semiconductor devices 1d that is subsequently carried out, pieces and unnecessary portions, as described above, can be prevented from jumping off, and sticking to the surface of semiconductor devices 1d. In addition, waste created in the semiconductor device manufacturing processes can be eliminated, and an environmentally friendly semiconductor device manufacturing processes can be provided.

Here, though in the above-described respective embodiments, a case where the mask layer 5 that has been formed on the semiconductor wafer 1 is processed with a laser beam is described on the basis of the arrangement data on the unit-device-formation-regions R1 and the removal-regions R2 is described, the present invention is not limited to these cases. Instead of such a case, it may be the case that a mask where mask patterns have already been prepared on the basis of the above described arrangement data is placed on the processing-target-face 1b of the semiconductor wafer 1, and thereby, the entirety of the surface of the semiconductor wafer 1 in the removal-regions R2 is exposed.

That is to say, in the case where pieces of the mask are arranged in the mask patterns that is used for the plasma dicing process so that the surfaces of the removal-regions R2 are exposed, any of a variety of techniques for forming a mask for the plasma dicing process may be used.

In addition, though in the above description, a case where the semiconductor wafer 1 has the orientation flat F is described, a dividing method and a manufacturing method according to the present embodiments can be applied to a semiconductor wafer where no orientation flat F is formed.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

The disclosure of Japanese Patent Application No. 2004-292181 filed on Oct. 5, 2004 including specification, drawing and claims are incorporated herein by reference in its entirety.

The invention claimed is:

1. A method for dividing a semiconductor wafer, the method comprising:

placing a mask on a mask placement-side surface of the semiconductor wafer which has a plurality of semiconductor devices formed in unit-device-formation-regions, respectively, with the unit-device-formation-regions being regions in rectangular form partitioned by imaginary-dividing-lines and being some of a plurality of imaginary-divided-regions which are partitioned by the imaginary-dividing-lines that are respectively arranged in a grid-like arrangement on the semiconductor wafer and a circumferential line that is an outer periphery outline of the semiconductor wafer, wherein the mask is placed so as to define dividing lines for dividing the semiconductor wafer into individual pieces of the semiconductor devices by arranging the dividing lines on the wafer while aligning with the imaginary-dividing-lines, and so as to cover an entirety of surfaces of the wafer corresponding to respective remaining-regions, with the remaining-regions being regions in approximately quadrangular form and/or pentagonal form partitioned by the circumferential line of the wafer and the imaginary-dividing-lines and being regions which are not included in the unit-device-formation-regions, and so as to expose an entirety of surfaces of the wafer corresponding to respective removal-regions, with the removal-regions being regions in approximately triangular form partitioned by the circumferential line of the wafer and the imaginary-dividing-lines and being some of the imaginary-divided-regions; and performing plasma etching on the mask placement-side surface of the wafer on which the mask is placed, by which the semiconductor wafer is divided into the individual semiconductor devices along the defined dividing lines while portions corresponding only to dividing lines and the removal-regions of the wafer are removed, and while portions corresponding to the remaining-regions of the wafer remain such that only the dividing lines and the triangular regions are removed.

2. The method for dividing a semiconductor wafer as defined in claim 1, wherein each line segment which is formed of each of the imaginary-dividing-lines, which partitions each of the removal-regions has a length which is shorter than the length of each line segment which partitions each of the unit-device-formation-regions.

3. The method for dividing a semiconductor wafer as defined in claim 1, wherein in placing the mask, the dividing lines are defined by placing the mask on the mask placement-side surface so as to expose an entirety of surfaces of the wafer corresponding to the positions on which the imaginary-dividing-lines are arranged.

4. The method for dividing a semiconductor wafer as defined in claim 1, wherein in placing the mask on the wafer, the mask is placed so as to cover the entire mask placement-side surface, and then the mask is partially removed along the dividing lines of the wafer so as to expose the surface of the wafer, while the mask is partially removed so as to expose the surfaces corresponding to the removal-regions.

5. The method for dividing a semiconductor wafer as defined in claim 1, wherein in placing the mask on the wafer, positional information on the removal-regions in the wafer is acquired, and then the mask is placed so as to expose the entirety of the surfaces corresponding to the removal-regions on a basis of the acquired positional information.

6. A manufacturing method for semiconductor devices, the method comprising:

dividing the semiconductor wafer, in accordance with the method for dividing the semiconductor wafer as defined in claim 1, into the individual semiconductor devices along the dividing lines while removing only the removal-regions of the wafer; and removing the mask by performing an ashing process on the mask placement-side surface of the wafer, and thereby, the semiconductor devices are manufactured as individual pieces.

* * * * *